United States Patent
Hiraku

(10) Patent No.: US 9,819,351 B2
(45) Date of Patent: *Nov. 14, 2017

(54) PLL CIRCUIT AND OPERATION METHOD

(71) Applicant: Renesas Electronics Corporation, Tokyo (JP)

(72) Inventor: Yasuyuki Hiraku, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/431,843

(22) Filed: Feb. 14, 2017

(65) Prior Publication Data

US 2017/0155396 A1    Jun. 1, 2017

Related U.S. Application Data

(63) Continuation of application No. 15/178,775, filed on Jun. 10, 2016, now Pat. No. 9,608,646.

(30) Foreign Application Priority Data

Aug. 24, 2015    (JP) ................ 2015-164582

(51) Int. Cl.
  *H03L 7/06*  (2006.01)
  *H03L 7/095*  (2006.01)
  *H03L 7/183*  (2006.01)
  *H03L 7/089*  (2006.01)
  *H03L 7/091*  (2006.01)

(52) U.S. Cl.
  CPC ........... *H03L 7/095* (2013.01); *H03L 7/0891* (2013.01); *H03L 7/091* (2013.01); *H03L 7/183* (2013.01)

(58) Field of Classification Search
  CPC ..... H03L 7/00; H03L 7/06; H03L 7/08; H03L 7/085
  USPC .................................................. 327/156–158
  See application file for complete search history.

(56) References Cited

U.S. PATENT DOCUMENTS

| | | |
|---|---|---|
| 6,690,240 B2 | 2/2004 | Maxim et al. |
| 6,998,923 B2 | 2/2006 | Melanson |
| 7,999,586 B2 | 8/2011 | Lee et al. |
| 8,098,972 B2 | 1/2012 | Okamoto et al. |
| 8,368,435 B2 | 2/2013 | Talaga, Jr. |

(Continued)

OTHER PUBLICATIONS

Yin et al., "A 0.7-to-3.5 GHz .06-to-2.8 mW Highly Digital Phase-Locked Loop With Bandwith Tracking", IEEE Journal of Solid-State Circuits, Aug. 2011, pp. 1870-1880, vol. 46, No. 8.

*Primary Examiner* — Lincoln Donovan
*Assistant Examiner* — Diana J Cheng
(74) *Attorney, Agent, or Firm* — Sughrue Mion, PLLC

(57) ABSTRACT

A PLL circuit having a desired performance is provided. A PLL circuit (100) includes a phase comparator (11) that detects a phase difference; a voltage control oscillator (12) that generates a signal to be returned to the phase comparator (11); and a loop filter (10) that is disposed between the phase comparator (11) and the voltage control oscillator (12) and includes an adder (50) that adds outputs from a proportional path (20), a first integral path (40), and a second integral path (30). The second integral path (30) and the first integral path (40) each include a cumulative adder, a ΔΣ modulator, and an RC filter. The lock detector (36) detects a lock state, controls a gain of the first cumulative adder (42) and a bandwidth of the first RC filter (45), and switches an input to a second ΔΣ modulator (33) to a fixed value.

10 Claims, 12 Drawing Sheets

(56) References Cited

U.S. PATENT DOCUMENTS 8,508,270 B2    8/2013   Yaghini et al.
8,513,995 B2    8/2013   Wang et al.

PLL CIRCUIT AND OPERATION METHOD

CROSS-REFERENCE TO RELATED APPLICATIONS

This is a continuation of application Ser. No. 15/178,775 filed Jun. 10, 2016, which is based upon and claims the benefit of priority from Japanese patent application No. 2015-164582, filed on Aug. 24, 2015, the disclosure of which is incorporated herein in its entirety by reference.

BACKGROUND

The present invention relates to a PLL (Phase Locked Loop) circuit and an operation method thereof.

A digital PLL circuit using a bang-bang PD (bang-bang phase detector; hereinafter referred to as a BB-PD) as a phase detector is disclosed in IEEE J. Solid-State Circuits, vol. 46, No. 8, AUGUST 2011 "A 0.7-to-3.5 GHz 0.6-to-2.8 mW Highly Digital Phase-Locked Loop With Bandwidth Tracking" (hereinafter referred to as Non Patent Literature 1). The BB-PD outputs detected phase delay/advance information as a 1-bit digital signal. An integral path holds the delay/advance information and controls an IDAC using a holding code DI. A double integral path is also provided.

U.S. Pat. No. 7,999,586 discloses a PLL circuit including a proportional path (proportional path 150) and an integral path (integral path 160). The integral path accumulates output signals from a BB-PD. The proportional path is provided with a gain Ki. The integral path is divided into a proportional-integral path (proportional-integral path 190) and an integral-integral path (integral-integral path 200). The proportional-integral path is provided with a gain Kpi, and the integral-integral path is provided with a gain Kii.

U.S. Pat. No. 8,513,995 discloses a PLL circuit including a fast integral path (fast integral path 46), a slow integral path (slow integral Path 48), and a proportional path (proportional path 60). The fast integral path and the slow integral path are connected to each other through a low-pass filter (LPF 49).

However, the PLL circuits disclosed in the related art described above have a problem that it is difficult to achieve a PLL circuit having a desired performance.

Other problems to be solved by and novel features of the present invention will become apparent from the following description and the accompanying drawings.

SUMMARY

A first aspect of the present invention is a PLL circuit including a lock detector that detects a lock state based on a phase difference detected by a phase comparator. A first integral path and a second integral path are each provided with a cumulative adder, a modulator, a D/A converter, and a filter. The lock detector controls a gain of a first cumulative adder and a bandwidth of a first filter according to a detection result of the lock state, and switches an input to a second modulator to a fixed value.

According to the first aspect of the present invention, it is possible to provide a PLL circuit having a desired performance.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
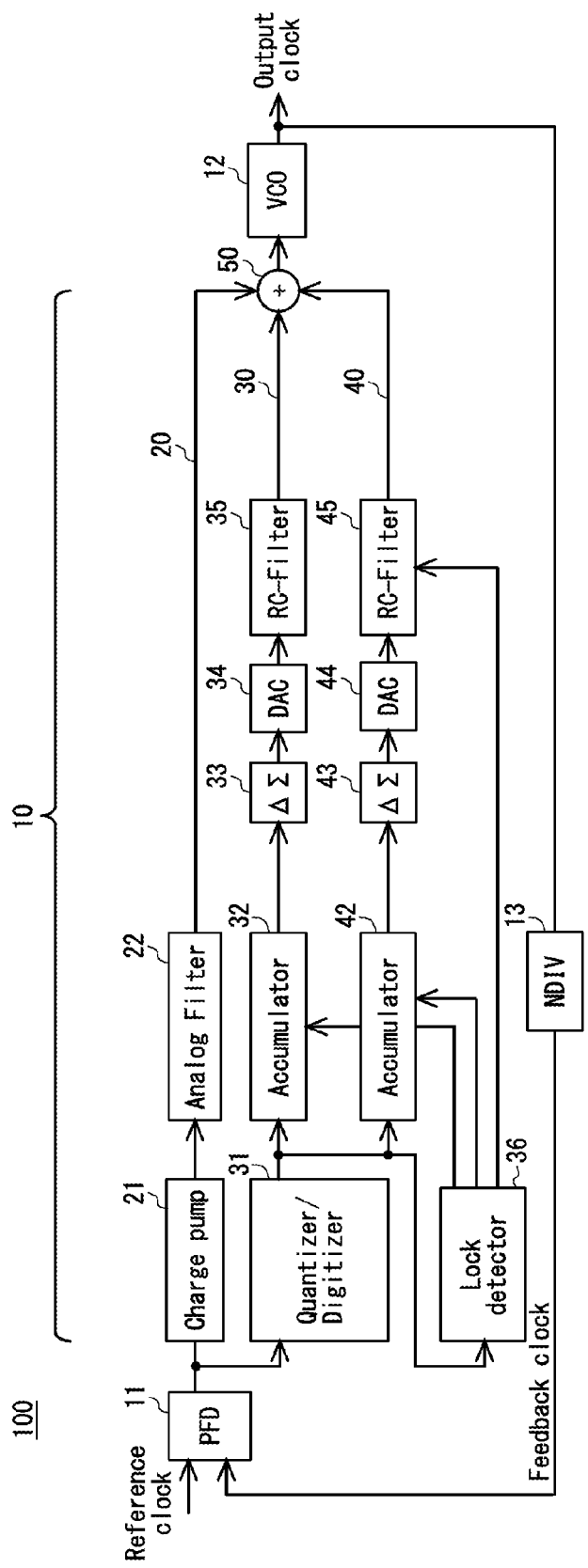
FIG. 1 is a circuit diagram showing a configuration of a PLL circuit according to a first embodiment.

The following description and the drawings are abbreviated or simplified as appropriate for clarity of explanation. The elements illustrated in the drawings as functional blocks for performing various processes can be implemented hardwarewise by a CPU, a memory, and other circuits, and softwarewise by a program loaded into a memory. Accordingly, it is understood by those skilled in the art that these functional blocks can be implemented in various forms including, but not limited to, hardware alone, software alone, and a combination of hardware and software. Note that in the drawings, the same elements are denoted by the same reference numerals, and repeated descriptions thereof are omitted as needed.

First Embodiment

A PLL circuit according to a first embodiment will be described with reference to FIG. 1. FIG. 1 is a circuit diagram showing a configuration of a PLL circuit 100 according to the first embodiment. The PLL circuit 100 includes a phase comparator 11, a loop filter 10, a voltage control oscillator 12, and a frequency divider 13.

The loop filter 10 is provided after the phase comparator 11. The voltage control oscillator 12 is provided after the loop filter 10. Accordingly, the loop filter 10 is disposed between the phase comparator 11 and the voltage control oscillator 12. The frequency divider 13 is disposed between the voltage control oscillator 12 and the phase comparator 11. The frequency divider 13 may not be provided.

The phase comparator (PFD) 11 receives a reference clock and a feedback clock. The phase comparator 11 compares the phase of the reference clock with the phase of the feedback clock. The phase comparator 11 outputs a signal based on the phase comparison result to the loop filter 10. The loop filter 10 is a low-pass filter and removes high-frequency components. The details of the loop filter 10 will be described later.

The signal from the loop filter 10 is input to the voltage control oscillator (VCO) 12. The voltage control oscillator 12 outputs a clock having a frequency corresponding to an input voltage. The output clock from the voltage control oscillator 12 is input to the frequency divider 13. The frequency divider 13 divides the frequency of the output clock by N (N is an integer equal to or greater than 1), and outputs the feedback clock to the PFD 11. Thus, the voltage control oscillator 12 generates the signal to be returned to the PFD 11.

Next, the configuration of the loop filter 10 will be described in detail. The loop filter 10 includes a proportional path 20, a first integral path 40, and a second integral path 30. The loop filter 10 also includes a lock detector 36 and an adder 50. The adder 50 adds an output from the proportional path 20, an output from the first integral path 40, and an output from the second integral path 30, and outputs the addition result to the voltage control oscillator 12.

The proportional path 20 includes a charge pump circuit 21 and an analog filter 22. The analog filter 22 is provided after the charge pump circuit 21.

The first integral path 40 includes a quantizer 31, a first cumulative adder 42, a first $\Delta\Sigma$ modulator 43, a first DAC (Digital Analog Converter) 44, and a first RC filter 45. The first cumulative adder 42 is provided after the quantizer 31. The first $\Delta\Sigma$ modulator 43 is provided after the first cumulative adder 42. The first DAC 44 is provided after the first $\Delta\Sigma$ modulator 43.

The second integral path 30 includes the quantizer 31, a second cumulative adder 32, a second $\Delta\Sigma$ modulator 33, a second DAC (Digital Analog Converter) 34, and a second RC filter 35. The second cumulative adder 32 is provided after the quantizer 31. The second $\Delta\Sigma$ modulator 33 is provided after the second cumulative adder 32. The second DAC 34 is provided after the second $\Delta\Sigma$ modulator 33.

The phase comparator 11 outputs the signal based on the phase comparison result to each of the charge pump circuit 21 and the quantizer 31. For example, a BB-PD (bang-bang phase detector) can be used as the phase comparator 11. In this case, the phase comparator 11 converts the phase comparison result into 1-bit delay/advance information. For example, when the phase of the reference clock is delayed from the phase of the feedback clock, the phase comparator 11 outputs "1", and when the phase of the reference clock is advanced with respect to the phase of the feedback clock, the phase comparator 11 outputs "0". Thus, the phase comparator 11 outputs a 1-bit digital signal every time the clocks are compared with each other. The phase comparator 11 is not limited to the BB-PD. For example, a Time-to-Digital Converter (TDC) that outputs a value proportional to a phase difference may also be used.

The proportional path 20 which is composed of analog circuits will now be described. The phase comparator 11 outputs the signal based on the phase comparison result to the charge pump circuit 21. The charge pump circuit 21 outputs a current based on the signal to the analog filter 22. Accordingly, the charge pump circuit 21 outputs the current based on the phase comparison result to the analog filter 22. The analog filter 22 rectifies the current from the charge pump circuit 21. The analog filter 22 is, for example, a high-pass filter. The signal which has passed through the analog filter 22 is input to the adder 50.

Next, the first integral path 40 including digital circuits will be described. The output from the phase comparator 11 is input to the quantizer 31. The quantizer 31 quantizes the digital signal output from the phase comparator 11. For example, assume that a 1-bit digital signal output from the phase comparator 11 is input to the quantizer 31. When the digital signal from the phase comparator indicates "1", the quantizer 31 outputs "1". When the digital signal indicates "0", the quantizer 31 outputs "−1". Thus, the quantizer 31 outputs a value according to the phase comparison result.

The first cumulative adder 42 multiplies the value quantized by the quantizer 31 by a gain, and cumulatively adds the multiplication results. Further, the first cumulative adder 42 outputs the cumulatively added value to the first $\Delta\Sigma$ modulator 43. The gain of the first cumulative adder 42 is variable.

The first $\Delta\Sigma$ modulator 43 performs A modulation on the cumulatively added value from the first cumulative adder 42, and quantizes the resultant value. Further, the first $\Delta\Sigma$ modulator 43 outputs the digital signal on which the A modulation is performed to the first DAC 44.

The first DAC 44 performs a DA conversion on the digital signal from the first $\Delta\Sigma$ modulator 43. For example, the first DAC 44 includes a plurality of current sources. The current sources are controlled according to the value of the digital signal. Specifically, a number of current sources corresponding to the value of the digital signal output a current. Accordingly, the first DAC 44 outputs a current according to the value of the digital signal to the first RC filter 45.

The first RC filter 45 is a noise removal filter, and removes noise in the current from the first DAC 44. Specifically, the first RC filter 45 reduces quantization noise and device noise of the DAC. Accordingly, the first RC filter 45 outputs the signal in which noise is reduced to the adder 50. The first RC filter 45 is a variable bandwidth filter. That is, the pass band of the first RC filter 45 is variable.

Next, the second integral path 30 including digital circuits will be described. The configuration of the second integral path 30 is basically similar to the configuration of the first integral path 40.

The output from the phase comparator 11 is input to the quantizer 31. The quantizer 31 is shared between the second integral path 30 and the first integral path 40. The second integral path 30 and the first integral path 40 share the quantizer 31. The quantizer 31 quantizes the digital signal output from the phase comparator 11. The quantizer 31 outputs the value according to the phase comparison result as described above.

The second cumulative adder 32 multiples the value quantized by the quantizer 31 by a gain, and cumulatively adds the multiplication results. The second cumulative adder 32 outputs the cumulatively added value to the second $\Delta\Sigma$ modulator 33. The gain of the second cumulative adder 32 may be variable. The operating frequency of the second $\Delta\Sigma$ modulator 33 may be higher than the operating frequency of the first $\Delta\Sigma$ modulator 43.

The second $\Delta\Sigma$ modulator 33 performs A modulation on the cumulatively added value from the second cumulative adder 32, and quantizes the resultant value. Further, the second $\Delta\Sigma$ modulator 33 outputs the digital signal on which the A modulation is performed to the second DAC 34.

The second DAC 34 performs a DA conversion on the digital signal from the second $\Delta\Sigma$ modulator 33. For example, the second DAC 34 includes a plurality of current sources. The current sources are controlled according to the value of the digital signal output from the second $\Delta\Sigma$ modulator 33. Specifically, a switch connected to each of the current sources is turned on and off according to the digital signal. Accordingly, a number of current sources corresponding to the value of the digital signal output a current. Thus, the second DAC 34 outputs the current according to the value of the digital signal to the second RC filter 35. The current mirror ratio of the second DAC 34 is different from the current mirror ratio of the first DAC 44. For example, the current mirror ratio of the first DAC 44 is larger than the current mirror ratio of the second DAC 34. Therefore, the first DAC 44 has a gain higher than that of the second DAC 34, and thus can output a high current. For example, the first DAC 44 can output a current that is about 10 times that of the second DAC 34.

The second RC filter 35 is a noise removal filter, and removes noise in the current from the second DAC 34. Specifically, the second RC filter 35 reduces quantization noise and device noise. Accordingly, the second RC filter 35 outputs the signal in which noise is reduced to the adder 50. The pass band of the second RC filter 35 may be variable. With this configuration, noise can be appropriately removed.

The adder 50 adds the signals from the proportional path 20, the first integral path 40, and the second integral path 30. The adder 50 outputs the added signal to the voltage control oscillator 12.

The loop filter 10 also includes the lock detector 36. The lock detector 36 detects a lock state of a PLL loop. In other words, the lock detector 36 detects a lock state or an unlock state of the PLL loop. Specifically, the lock detector 36 receives the digital signal from the quantizer 31. When the PLL loop reaches the vicinity of the lock state, the lock detector 36 detects the PLL lock state based on the digital signal. For example, when the digital signal from the quantizer 31 indicates "0" on average during a given time period, the phase detector 36 detects the PLL lock state. Specifically, when the digital signal indicates "0" on average during a given time period, there is no delay or advance in phase, so that the lock detector 36 detects that the frequency is locked. With this configuration, the lock detector 36 can appropriately detect the lock state.

The lock detector 36 detects the lock state based on the phase difference detected by the phase comparator 11. The PLL circuit 100 operates in a fast lock mode or a normal mode according to the detection result of the lock detector 36. Specifically, the PLL circuit 100 operates in the fast lock mode until the lock detector 36 detects the PLL lock state. After the lock detector 36 detects the PLL lock state, the PLL circuit 100 operates in the normal mode. Thus, the lock detector 36 changes the mode according to the detection result of the PLL lock state. The first integral path 40 is a path used in the fast lock mode, and the second integral path 30 is a path used in the normal mode.

Specifically, the lock detector 36 controls the gain of the first cumulative adder 42 and the bandwidth of the first RC filter 45 according to the detection result of the lock state. Further, the lock detector 36 switches the input to the first cumulative adder 42 to a fixed value according to the detection result of the lock state. These operations will be described later.

Figure 2:
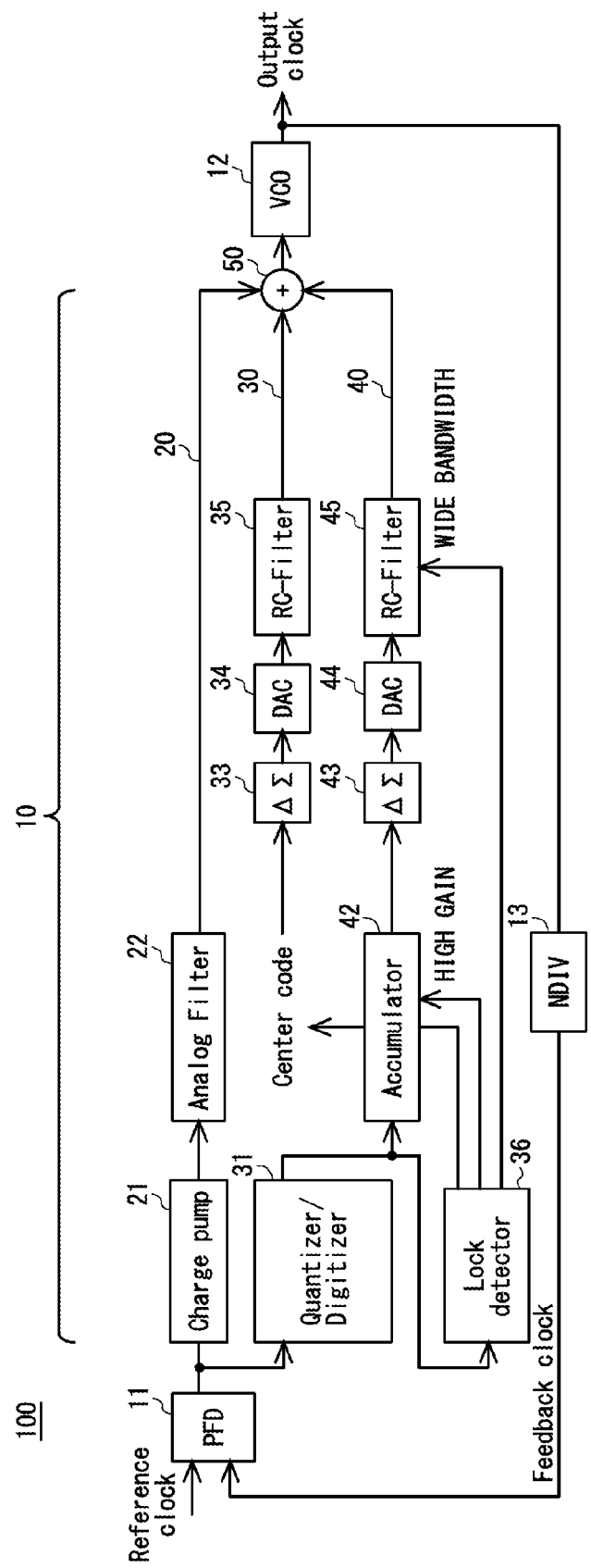
FIG. 2 is a diagram for explaining an operation in a fast lock mode of the PLL circuit according to the first embodiment.

Next, the operation modes of the PLL circuit 100 will be described with reference to FIG. 2. FIG. 2 is a diagram for explaining the operation in the fast lock mode. At the time of starting the operation of the PLL circuit 100, the PLL circuit 100 is in the fast lock mode, and uses the proportional path 20 and the first integral path 40 to achieve fast locking.

(Fast Lock Mode)

In the fast lock mode, the output of the second cumulative adder 32 of the second integral path 30 is fixed at an initial value. Specifically, in the fast lock mode, the second cumulative adder 32 constantly outputs a center code to the second ΔΣ modulator 33. Accordingly, the input of the second ΔΣ modulator 33 is a constant value irrespective of the value of the digital signal from the quantizer 31. Thus, when the lock detector 36 detects the phase unlock state, the input to the second ΔΣ modulator 33 is set to a fixed value.

The center code of the second cumulative adder 32 indicates a median in the range of values that can be cumulatively added by the second cumulative adder 32. In this case, the center code of the second cumulative adder 32 matches the center code of the second DAC 34. The second integral path 30 is a path that supplies an offset voltage or an offset current from the voltage control oscillator 12. In other words, the second integral path 30 is a path that does not make a PLL response.

Immediately after the operation of the PLL circuit 100 is started, the first integral path 40 is set to have a wide bandwidth, and pulls in the frequency at a high speed. Specifically, the first cumulative adder 42 is set to a high gain. The gain of the first cumulative adder 42 is higher than the gain of the second cumulative adder 32. The gain of the first cumulative adder 42 is set to a high level, so that the code of the first cumulative adder 42 changes at a high speed. The pass band of the first RC filter 45 is about the same as that of the second RC filter 35.

(Normal Mode)

Figure 3:
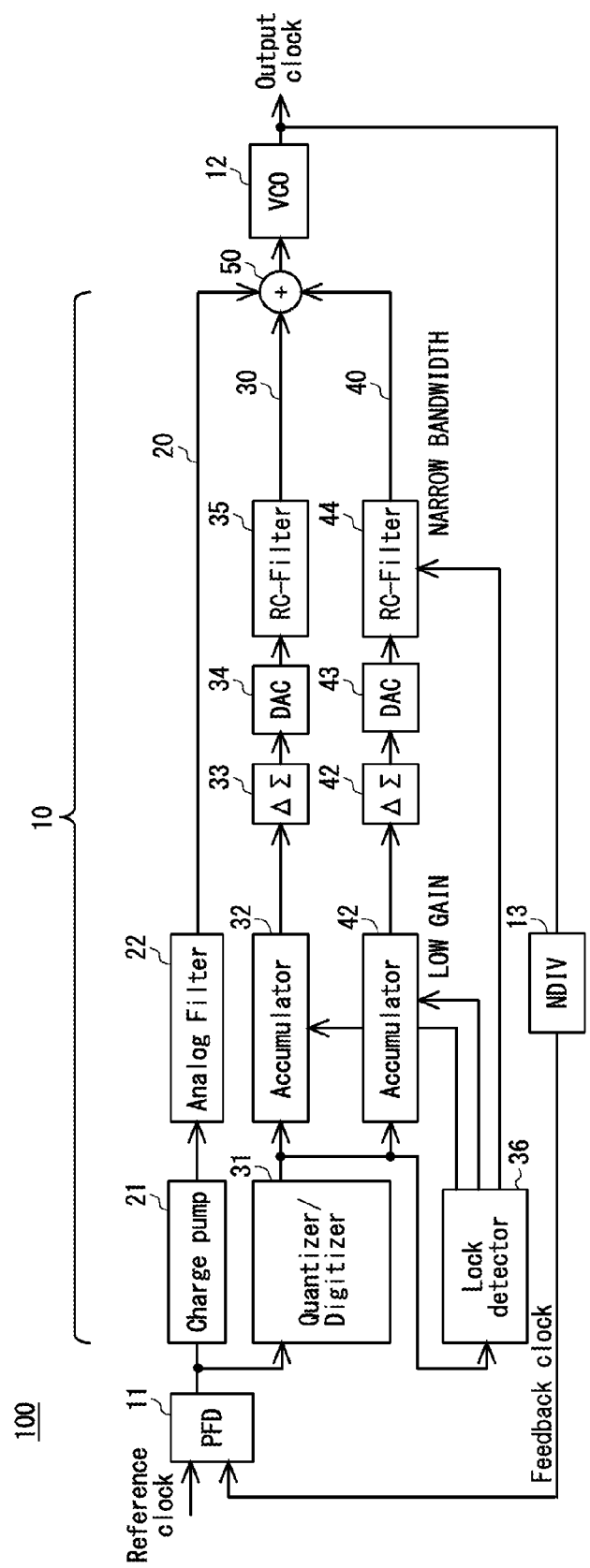
FIG. 3 is a diagram for explaining an operation in a normal mode of the PLL circuit according to the first embodiment.

Next, the normal mode will be described with reference to FIG. 3. As described above, when the PLL circuit 100 reaches the vicinity of the lock state, the lock detector 36 detects the PLL lock state. Further, the PLL circuit 100 is switched to the normal mode. Specifically, the second integral path 30 is set to a mode for making a PLL response. Accordingly, the second cumulative adder 32 outputs the cumulatively added value obtained by cumulatively adding the values of the digital signal from the quantizer 31. In other words, the cumulatively added value from the second cumulative adder 32 increases or decreases according to the digital signal from the quantizer 31.

Further, the gain of the first cumulative adder 42 of the first integral path 40 is reduced, and the pass band of the first RC filter 45 is set to a narrow bandwidth. Accordingly, the gain of the first cumulative adder 42 is lower than the gain of the second cumulative adder 32. The pass band of the first RC filter 45 is narrower than the pass band of the second RC filter 35. Thus, the gain of the first cumulative adder 42 in the normal mode is lower than that in the fast lock mode, and the bandwidth of the first DAC 44 in the normal mode is narrower than that in the fast lock mode.

In this manner, when the lock detector 36 detects the phase lock state, the gain of the first cumulative adder 42 is set to be lower than the gain of the second cumulative adder 32, and the bandwidth of the first RC filter 45 is set to be narrower than the bandwidth of the second RC filter 35.

In the first embodiment, immediately after the operation of the PLL circuit 100 is started, the PLL circuit 100 is in the unlock state, and thus operates in the fast lock mode. Accordingly, in the first integral path 40 with a high gain, the band frequency of the first RC filter 45 is set to a high level. Thus, the frequency of the VCO can be pulled in at a high speed, resulting in a reduction in lock time in comparison to Non Patent Literature 1. Since the first integral path 40 locks the frequency immediately after the PLL operation is started, it is necessary to determine the output code of the first integral path 40.

After the loop path of the first integral path 40 roughly locks the frequency, the PLL circuit is switched to the normal mode. The loop control is performed by the second integral path 30, and thus the bandwidth of the first integral path 40 can be set to a narrow bandwidth. Consequently, noise reduction and area reduction can be achieved. The first DAC 44 is designed with a low resolution, and the resolution is complemented equivalently by the first ΔΣ modulator 43. Noise in the first ΔΣ modulator 43 and noise in the first DAC 44 can be removed by the first RC filter 45 with a narrow bandwidth. Thus, noise can be reduced.

Since the first DAC 44 has a low resolution, the first DAC 44 can be designed to have a small number of bits, or a small number of cells. This leads to a reduction in circuit area. The first integral path 40 covers almost all the offset voltage (offset current) of the VCO that is necessary for oscillation. The first RC filter 45 which has a narrow bandwidth and is provided after the first DAC 44 cuts noise. The area of the second DAC 34 can be reduced to a minimum range (area), so that a reduction in noise in the entire PLL circuit 100 can be achieved.

Unlike in U.S. Pat. No. 8,513,995, in the first integral path 40, the first cumulative adder 42 can change mainly the bandwidth of the first integral path 40. Accordingly, the bandwidth of the second integral path 30 can be set to be equal to or lower than the bandwidth of the RC filter, while the PLL loop stability is maintained. For example, the bandwidth of the second integral path 30 can be set to be equal to or lower than several kHz, which is equal to or lower than the bandwidth of the RC filters. Therefore, this configuration is suitable for especially a PLL circuit with a narrow bandwidth and a PLL circuit using a BB-PD for phase detection. For example, when the BB-PD is used, the gain of the PLL circuit becomes non-linear and high, and thus it is essential to design the PLL circuit so that the bandwidth of the loop filter, i.e., the cumulative adder, is sufficiently lowered.

The second integral path 30 and the first integral path 40 have a similar configuration, which facilitates the circuit design. For example, the use of the second integral path 30 and the first integral path 40 enables each DAC and each ΔΣ modulator to have a similar circuit configuration. In this case, it is only necessary to change parameters. For example, the first ΔΣ modulator 43 and the second ΔΣ modulator 33 may be set to have different operating frequencies. Specifically, the operating frequency of the second ΔΣ modulator 33 may be set to be higher than that of the first ΔΣ modulator 43. Further, the current supplied from the current sources constituting the first DAC 44 may be different from the current supplied from the current sources constituting the second DAC 34. For example, the first DAC 44 may supply the current that is about 10 times that of the second DAC 34. Specifically, only the current mirror ratio of the current sources may be changed.

In the embodiment described above, in the fast lock mode, the input value to the second ΔΣ modulator 33 is set as the center code of the second cumulative adder 32, but the input value to the second ΔΣ modulator 33 is not limited to this. That is, the input value to the second ΔΣ modulator 33 may be any value other than the center code of the second cumulative adder 32, as long as the input value is a fixed value.

In the embodiment described above, the gain of the first cumulative adder 42 is switched in two stages, i.e., from the high gain to the low gain. However, the gain of the first cumulative adder 42 may be switched in multiple stages. For example, the gain of the first cumulative adder 42 may be gradually lowered by ½ from the high gain to the low gain of the normal mode. Thus, the gain of the first cumulative adder 42 may be changed stepwise.

Figure 4:
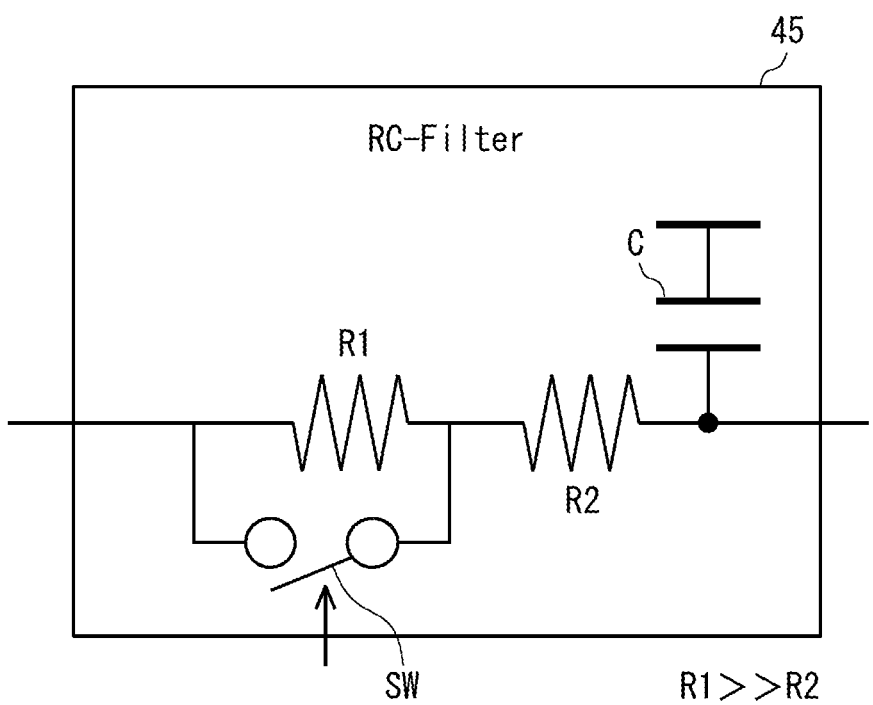
FIG. 4 is a circuit diagram showing a configuration of an RC filter.

Next, the configuration of the first RC filter 45 having a variable bandwidth will be described with reference to FIG. 4. FIG. 4 is a circuit diagram showing an example of the configuration of the first RC filter 45. The first RC filter 45 includes a resistor R1, a resistor R2, a capacitor C, and a switch SW. The resistor R1 and the resistor R2 are directly connected to each other between an input side and an output side of the first RC filter 45. One end of the resistor R2 is connected to the capacitor C. The switch SW is connected in parallel with the resistor R1. The resistance value of the resistor R1 is sufficiently larger than the resistance value of the resistor R2. The switch SW is controlled by a mode switch signal from the lock detector 36.

The bandwidth of the first RC filter 45 can be changed by controlling ON/OFF of the switch SW. In other words, at the time of switching the mode, the ON/OFF state of the switch SW is switched. In the example shown in FIG. 4, the first RC filter 45 is provided with one switch SW, and thus the bandwidth of the first RC filter 45 can be switched in two stages. The bandwidth of the first RC filter 45 may be switched in multiple stages. For example, the bandwidth of the first RC filter 45 can be switched in multiple stages by providing a plurality of pairs of a switch and a resistor which are connected in parallel.

Figure 5:
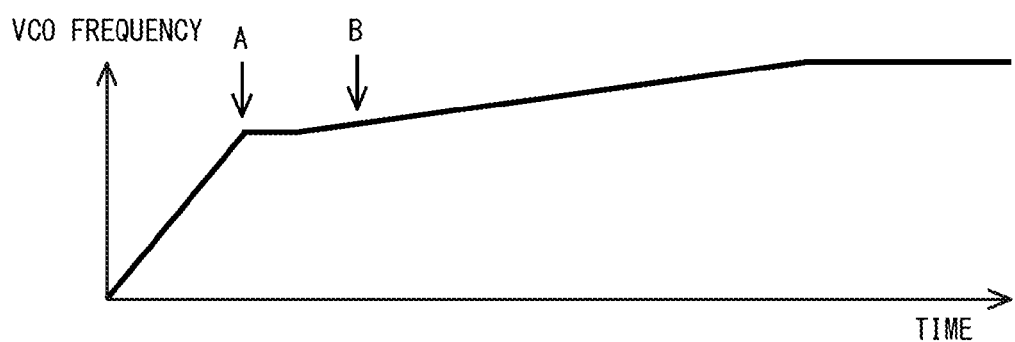
FIG. 5 is a graph for explaining a lock process according to a comparative example.
Figure 6:
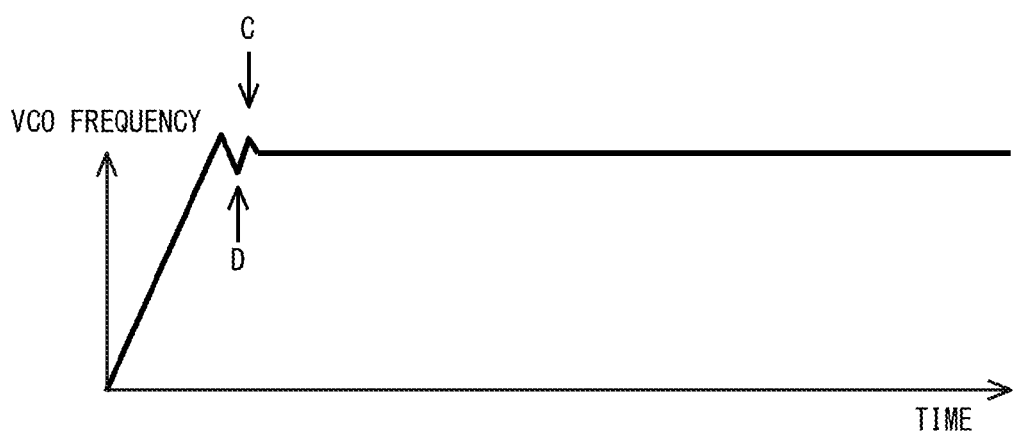
FIG. 6 is a graph for explaining a lock process in the first embodiment.

A lock process in a comparative example and a lock process in the first embodiment will be described with reference to FIGS. 5 and 6. FIG. 5 is a graph schematically showing the lock process in the comparative example. FIG. 6 is a graph schematically showing the lock process in the first embodiment. In FIGS. 5 and 6, the horizontal axis represents time from the start of the PLL operation, and the vertical axis represents the frequency (VCO frequency) of the voltage control oscillator 12. FIG. 5 shows a time variation of the VCO frequency in the configuration of the comparative example disclosed in Non Patent Literature 1 or U.S. Pat. No. 8,513,995. FIG. 6 shows a time variation of the VCO frequency in the configuration of the first embodiment.

In the comparative example, when the frequency limit achieved by use of one of the integral paths and the proportional path is reached (time A), the other one of the integral paths gradually starts to respond. Then, the VCO frequency gradually starts to increase (time B).

On the other hand, in the first embodiment, as shown in FIG. 6, the frequency is pulled in at once by the first integral path 40 and the proportional path 20. In other words, the frequency is locked at once in the fast lock mode. At this time, the bandwidth of the loop is wide and the response of the loop is fast. Since the gain is high, the VCO frequency fluctuates in some cases (time D). At time C, the mode is switched, so that the loop is switched to the loop of the second integral path 30 and the proportional path 20.

The first integral path 40 has a wide bandwidth and the first DAC 44 of the first integral path 40 has a high gain, so that fast PLL lock can be achieved. Consequently, a reduction in the lock time of a digital controlled high accuracy PLL circuit can be achieved.

In the comparative example, when the BB-PD is used as the phase comparator 11, the BB-PD outputs 1-bit delay/advance information. In the frequency lock process immediately after the PLL operation is started, the output code has a constant value even if there is a large phase difference. Therefore, a variation in VCO control code per unit time decreases, which results in an increase in lock time. In the phase lock process after the frequency lock is completed, the phase difference is close to 0. When the phase difference is close to 0, the gain of the BB-PD is extremely high. Accordingly, in order to secure the stability of the loop, it is necessary to lower the gain of the cumulative adder which is provided after the BB-PD. However, if the gain of the cumulative adder is lowered, the frequency lock time increases.

In the first embodiment, since the first cumulative adder 42 operates at a high gain in the fast lock mode, a reduction in lock time immediately after the PLL operation can be achieved. Further, in the normal mode, the first cumulative adder 42 operates at a low gain. Thus, by changing the gain of the first cumulative adder 42 according to the operation mode, the stability of the loop can be secured. In the fast lock mode, a fixed value is output to the second ΔΣ modulator 33, so that the second integral path 30 is outside of the loop of the PLL response. In the normal mode, the second integral path 30 is in the loop of the PLL response.

Furthermore, the first slow integral path 40 is provided to achieve low jitter and area saving. In the first integral path 40, the first ΔΣ modulator 43 with a low resolution can be used, which leads to a reduction in the area of the first ΔΣ modulator 43. Moreover, quantization noise during modulation and DAC noise are removed by the first RC filter 45 of the subsequent stage. Though the first integral path 40 is in the loop of the PLL response in the normal mode, the loop bandwidth of the first integral path 40 is lowered by the first RC filter 45, and thus the first integral path 40 can be used without problem. Accordingly, in the first embodiment, the PLL circuit 100 capable of fast locking and appropriately removing noise can be achieved. Therefore, the PLL circuit 100 having a desired performance can be provided.

On the other hand, in Non Patent Literature 1, the integral path is a path that makes a PLL loop response, and the double integral path is a path that is outside of the PLL loop response. The double integral path is a path for performing background calibration on an offset voltage or an offset current for VCO control. When the code DI is outside the range of −k to +k, the double integral path having a bandwidth sufficiently lower than the loop bandwidth responds. The offset voltage or offset current for VCO control is corrected by increasing or decreasing the code DC.

Accordingly, a narrow-band filter cannot be disposed in the subsequent stage of an IDAC. It is necessary to generate almost all the offset voltage (offset current) necessary for oscillation using a CDAC with a low resolution and a ΔΣ modulator. The IDAC with an excellent resolution has only a minimum frequency range so that an increase in the area of the IDAC can be prevented.

The frequency range that can be controlled by the IDAC is smaller than the frequency range that can be controlled by the CDAC. Accordingly, it is impossible to lock the frequency by using only the integral path immediately after the PLL operation is started. In other words, the frequency lock cannot be achieved without performing calibration operation in the double integral path. Every time the code DI exceeds ±K, the background calibration operation is performed in the double integral path, thereby gradually locking the frequency. The response of the double integral path is sufficiently slower than the loop bandwidth, which causes a problem that it takes a long time to lock the frequency. Further, when a filter having a narrow bandwidth that is equal to or lower than several kHz is disposed in the subsequent stage of the CDAC to achieve a reduction in noise and area saving, several hundred μsec, which corresponds to the response time, is required to lock the frequency. Thus, Non Patent Literature 1 has a problem that there is a trade-off between a noise reduction effect and a lock time.

In U.S. Pat. No. 7,999,586, fast locking cannot be achieved immediately after the PLL operation is started, and noise cannot be reduced after the locking. In the PLL circuit according to the first embodiment, a reduction in lock time and a reduction in noise can be achieved.

In U.S. Pat. No. 8,513,995, in order to secure the stability of the PLL loop, the band frequency of the fast integral path (fast integral path 46) cannot be lowered to several kHz to several tens kHz or less. Therefore, the technique disclosed in U.S. Pat. No. 8,513,995 is not suitable for a PLL circuit with a narrow bandwidth and a PLL circuit using a BB-PD for phase detection. For example, when the BB-PD is used, the gain of the PLL circuit becomes non-linear and high, and thus it is essential to design the PLL circuit so that the loop bandwidth is sufficiently lowered.

In terms of the loop stability of the PLL circuit, it is necessary that the bandwidth of the fast integral path be sufficiently separated from the bandwidth of the slow integral path (slow integral path 48). The band frequency of the slow integral path is determined mainly by a low-pass filter (LPF 40). The bandwidth of the slow integral path is set to a low value, for example, several kHz, in terms of the device size. Considering that the current source mirror ratio of (slow integral path):(fast integral path) is 10:1, the band frequency of the fast integral path that is at least 20 times (50 times if possible) that of the fast integral path is required. Accordingly, the lower limit of the band frequency of the fast integral path is about several tens kHz to several hundred kHz. The band frequency in the PLL circuit according to the first embodiment can be reduced in comparison with U.S. Pat. No. 8,513,995. Therefore, according to the first embodiment, a desired band frequency can be obtained even in the configuration using the BB-PD for phase detection.

Second Embodiment

Figure 7:
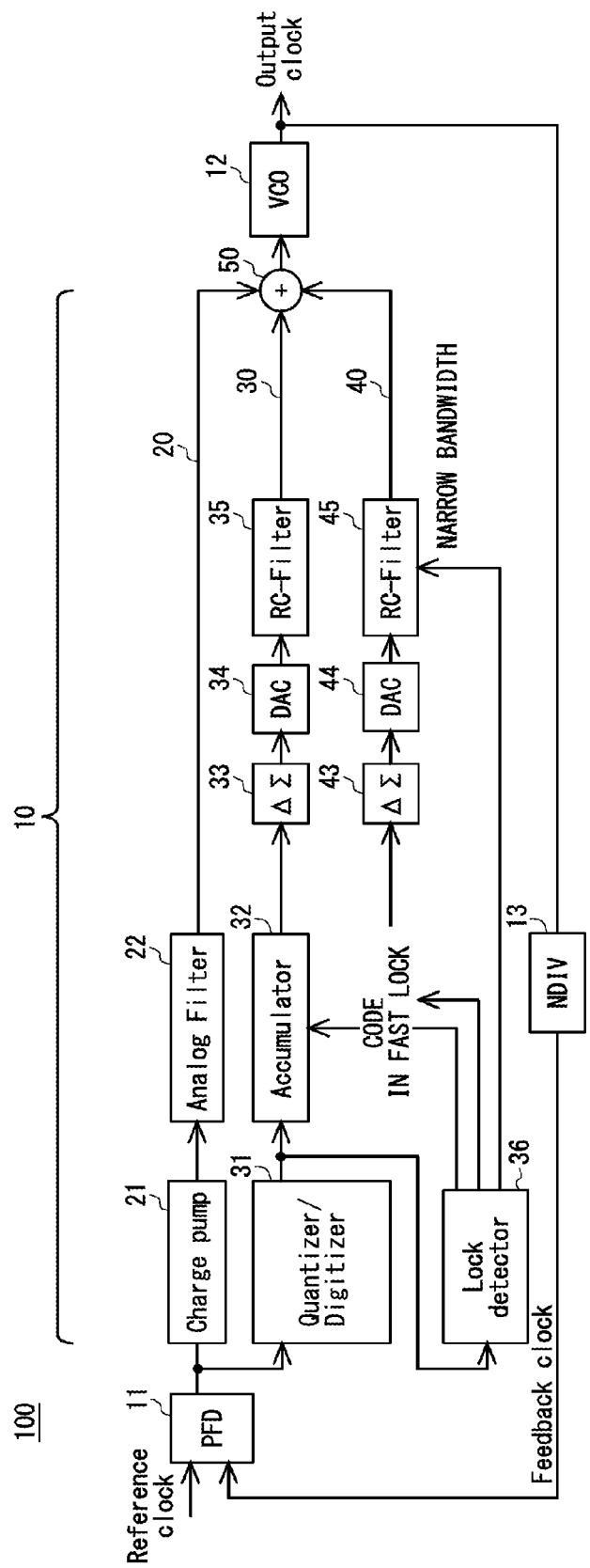
FIG. 7 is a diagram for explaining an operation in a normal mode of a PLL circuit according to a second embodiment.

The PLL circuit 100 according to a second embodiment will be described with reference to FIG. 7. FIG. 7 is a diagram for explaining the operation in the normal mode of the PLL circuit 100. The second embodiment differs from the first embodiment in regard to the normal mode operation. Descriptions of the components of the second embodiment that are similar to the components of the first embodiment are omitted as appropriate. For example, the basic configuration of the PLL circuit 100 according to the second embodiment is similar to that of the first embodiment. The operation in the fast lock mode according to the second embodiment is also similar to that of the first embodiment. Accordingly, descriptions of the basic configuration of the PLL circuit and the fast lock mode will be omitted.

In the second embodiment, the code used when the first cumulative adder 42 is locked at a high speed is fixed. After the operation mode is switched to the normal mode, in the first integral path 40, the operation of the first cumulative adder 42 is interrupted and the code used when the fast locking is completed is held. In other words, the gain of the first cumulative adder 42 becomes 0. Accordingly, in the normal mode, the input of the first ΔΣ modulator 43 has a constant value. Therefore, the operating rate of the first integral path 40 can be lowered, which leads to a reduction in power. For example, it is possible to achieve a power reduction by interrupting the supply of a clock signal to the first cumulative adder 42.

In the normal mode, a fixed value is input to the first ΔΣ modulator 43, and thus the first integral path 40 is outside of the loop of the PLL response. In the fast lock mode, the first integral path 40 is in the loop of the PLL response. In this manner, the response of the loop is switched according to the lock detection result from the lock detector 36.

Third Embodiment

Figure 8:
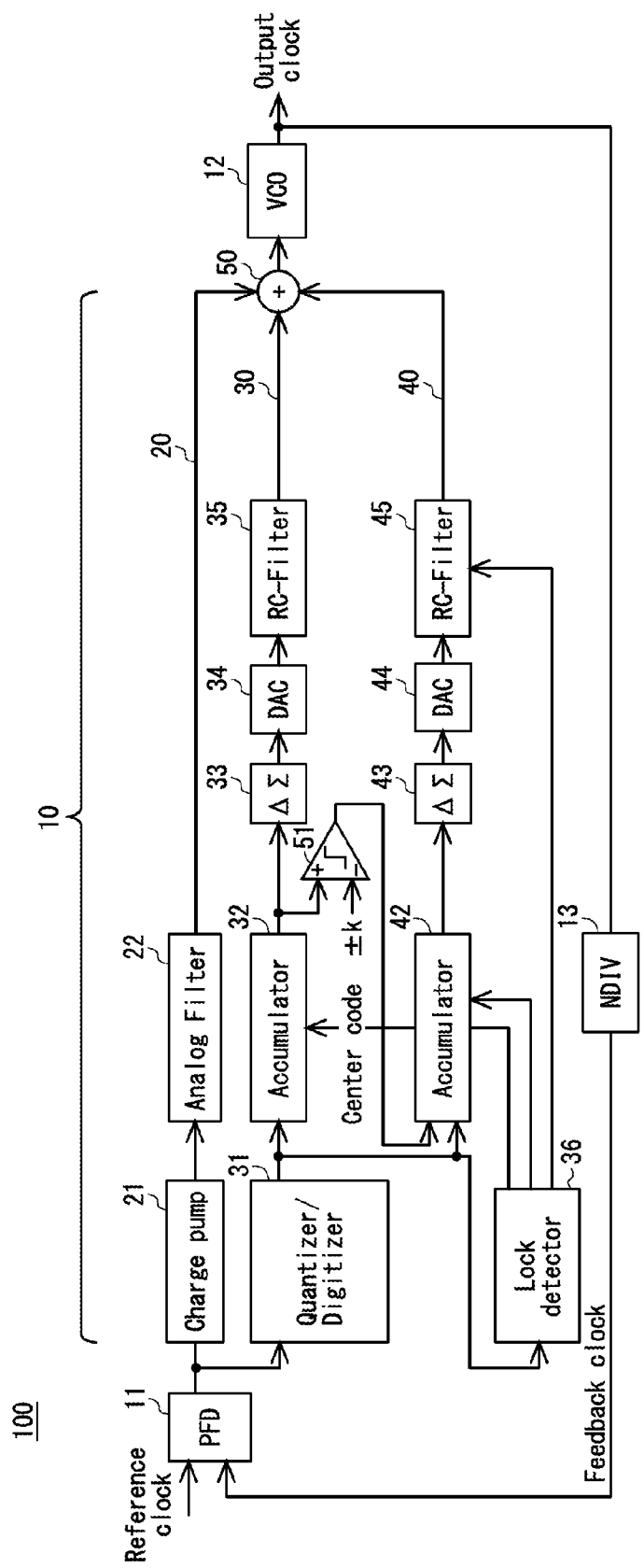
FIG. 8 is a circuit diagram showing a configuration of a PLL circuit according to a third embodiment.

The PLL circuit 100 according to a third embodiment will be described with reference to FIG. 8. FIG. 8 is a circuit diagram showing the configuration of the PLL circuit 100. The PLL circuit 100 according to the third embodiment has a configuration in which a comparator 51 is added to the configuration of the first or second embodiment. The components of the third embodiment other than the comparator 51 are similar to the components of the first and second embodiments, and thus the descriptions thereof are omitted.

According to the third embodiment, in the normal mode, when the output code of the second cumulative adder 32 reaches an upper limit or a lower limit, the first integral path 40 executes background calibration so that the code of the second cumulative adder 32 can be returned to the center code. Accordingly, in the normal mode, the first integral path 40 is outside of the loop of the PLL response.

The comparator 51 receives the cumulatively added value from the second cumulative adder 32. In this case, the center code is represented by "c". The cumulatively added value output from the second cumulative adder 32 is in a range from (c−k) to (c+k). That is, assume that the range of values that can be cumulatively added by the second cumulative adder 32 is represented by c±k. The comparator 51 compares the cumulatively added value with c±k, and outputs a comparison signal according to the comparison result. Specifically, the comparator 51 determines whether the cumulatively added value falls within the range from (c−k) to (c+k). When the cumulatively added value reaches the upper limit (c+k) or the lower limit (c−k), the comparator 51 outputs the comparison signal to the first cumulative adder 42. Accordingly, the first integral path 40 performs background calibration.

Figure 9:
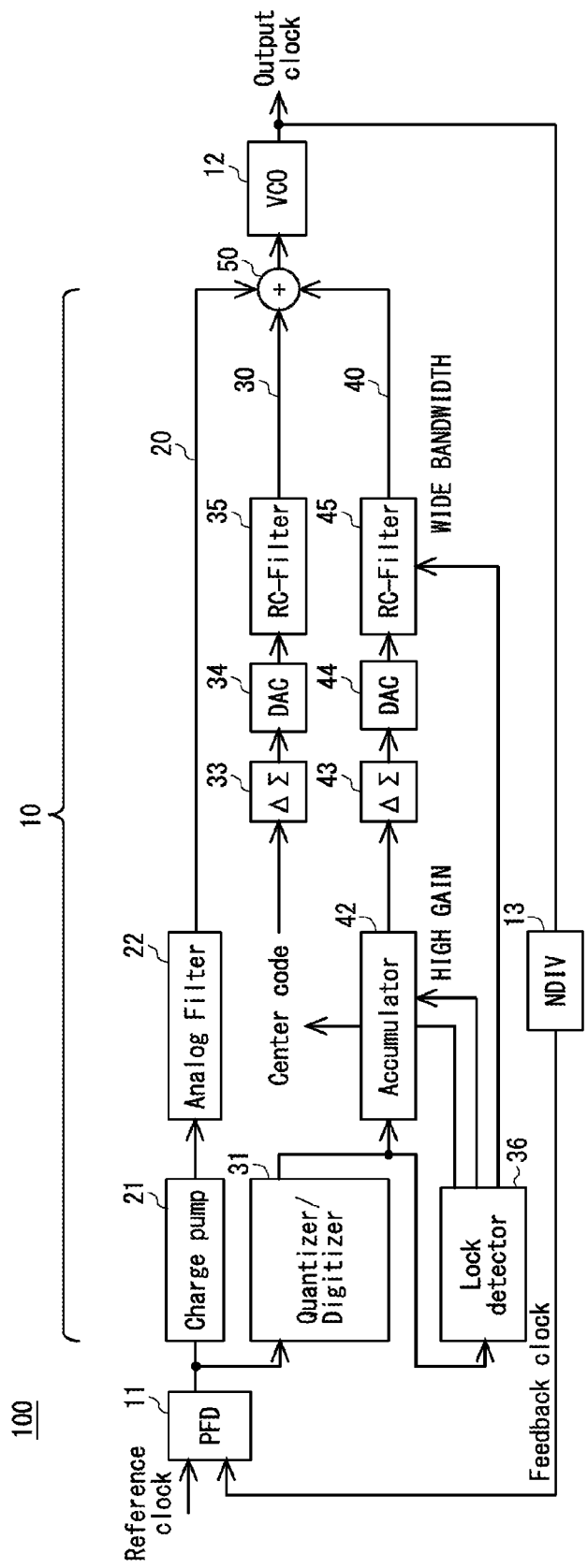
FIG. 9 is a diagram for explaining an operation in a fast lock mode of the PLL circuit according to the third embodiment.

In the fast lock mode, as shown in FIG. 9, the center code of the second cumulative adder 32 of the second ΔΣ modulator 33 is input. Accordingly, the second integral path 30 is outside of the loop of the PLL response. The lock detector 36 sets the gain of the first cumulative adder 42 to a high gain. The fast lock mode is similar to that of the first and second embodiment, and thus the detailed description thereof is omitted. The comparator 51 may not operate in the fast lock mode.

Figure 10:
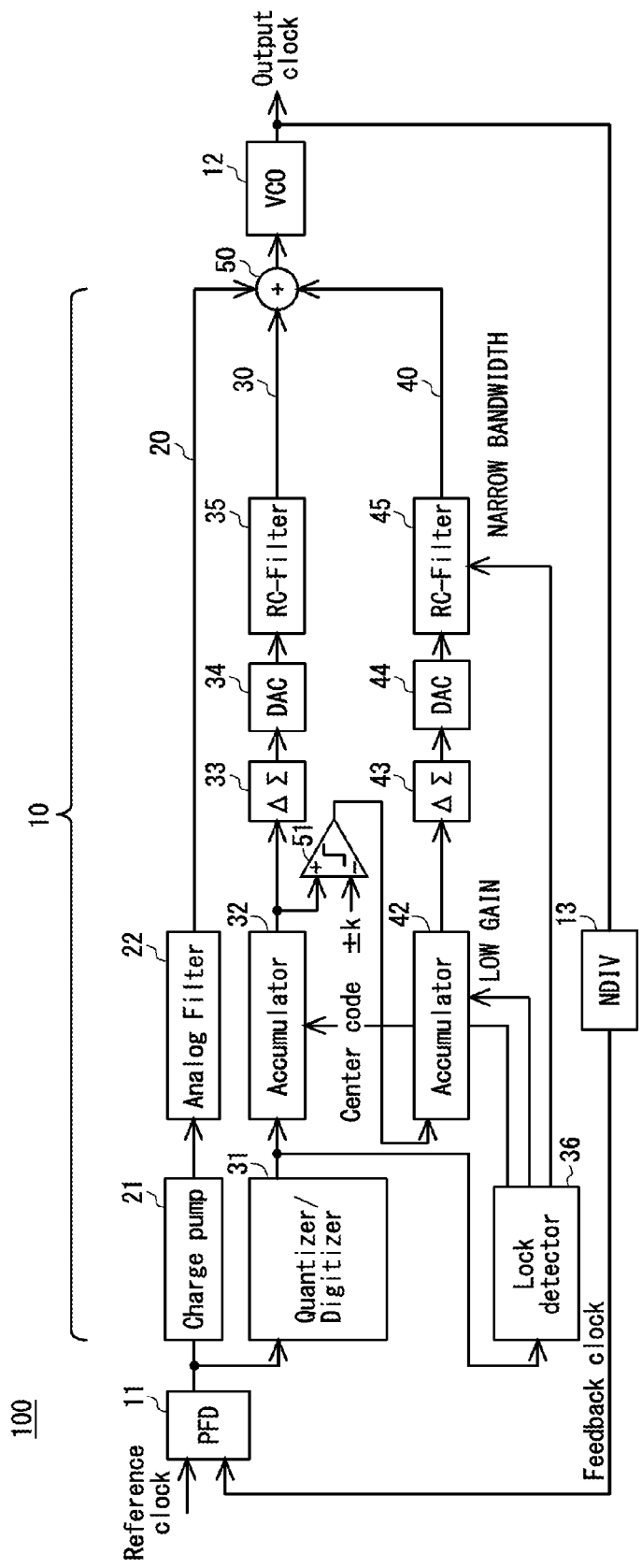
FIG. 10 is a diagram for explaining an operation in a normal mode of the PLL circuit according to the third embodiment.

In the normal mode, as shown in FIG. 10, the second cumulative adder 32 outputs the cumulatively added value to each of the second ΔΣ modulator 33 and the comparator 51. The second ΔΣ modulator 33, the second DAC 34, and the second RC filter 35 of the second integral path 30 are the same as those of the first embodiment, and thus the detailed descriptions thereof are omitted. The comparator 51 determines whether the cumulatively added value from the second cumulative adder 32 has reached the lower limit (c−k) or the upper limit (c+k).

When the cumulatively added value from the second cumulative adder 32 has reached the upper limit (c+k) or the lower limit (c−k) of the cumulative addition range, the first cumulative adder 42 receives the comparison signal from the comparator 51. The first cumulative adder 42 executes background calibration according to the comparison signal. After the second cumulative adder 32 returns to the center code, the first cumulative adder 42 completes the background calibration operation.

Figure 11:
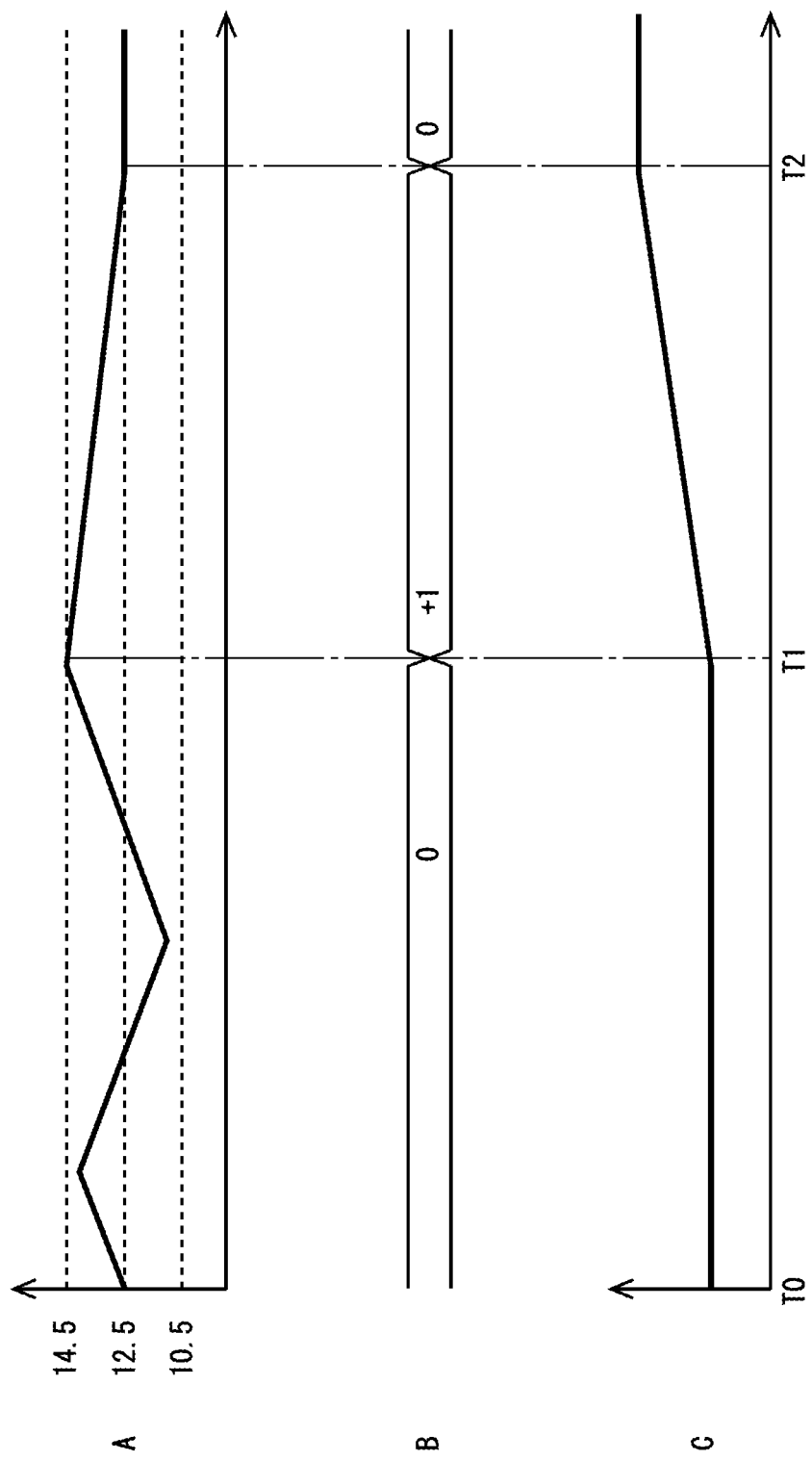
FIG. 11 shows graphs A to C for explaining background calibration in the third embodiment.

The background calibration operation will be described with reference to FIG. 11. FIG. 11 shows graphs A to C schematically showing the output code of the second cumulative adder 32 and the output code of the first cumulative adder 42. Specifically, The graph A of FIG. 11 shows the output code of the second cumulative adder 32, and the graph C of FIG. 11 shows the output code of the first cumulative adder 42. The graph B of FIG. 11 shows the comparison signal of the comparator 51. In FIG. 11, assuming that the center code "c" of the second cumulative adder 32 is 12.5 and assuming that k is 2. That is, the cumulative addition range of the second cumulative adder 32 is 10.5 to 14.5.

In a period from time T0 to time T1, the output code of the second cumulative adder 32 falls within the cumulative addition range. At time T1, the output code of the second cumulative adder 32 reaches the upper limit (14.5). Then, the comparator 51 outputs the comparison signal (+1 shown in the graph A of FIG. 11) to execute background calibration.

In this case, since the second cumulative adder 32 has reached the upper limit, the output code of the first cumulative adder 42 increases (as shown in the graph C of FIG. 11). In other words, since the input value of the first cumulative adder 42 is +1, the cumulatively added value of the first cumulative adder 42 increases. The DAC current is generated due to an increase in the code of the first integral path 40, so that the output code of the second cumulative adder 32 starts to decrease in the PLL loop operation. The background calibration operation is carried out until the output code of the second cumulative adder 32 returns to the center code. In other words, during a period (from time T1 to time T2) before the output code of the second cumulative adder 32 returns to the center code, the output code of the first cumulative adder 42 continuously increases. In the background calibration operation, the first cumulative adder 42 operates at a low gain and the first RC filter 45 has a narrow bandwidth.

When the output code of the second cumulative adder 32 returns to the center code (time T2), the background calibration operation is completed. The comparison signal indicates 0, so that the output code of the second cumulative adder 32 is fixed. The operation in the normal mode is performed in the same manner as in the first and second embodiments.

In the embodiment described above, when the output code of the second cumulative adder 32 reaches the upper limit, the output code of the first cumulative adder 42 increases. However, when the output code of the second cumulative adder 32 reaches the lower limit, the output code of the first cumulative adder 42 may decrease.

In the third embodiment, when the output code of the second cumulative adder 32 reaches the upper limit or the lower limit, the first integral path 40 executes the background calibration. The first integral path 40 executes the background calibration so that the second cumulative adder 32 returns to the center code. Accordingly, the number of bits of the second DAC 34 and the area of the second DAC 34 can be reduced. Even when the DAC code of the second cumulative adder 32 drifts due to variations in voltage or temperature, the output code of the first cumulative adder 42 varies. Thus, variations in voltage and temperature can be dealt with. Therefore, the PLL loop tracking range can be widened.

MODIFIED EXAMPLE 1

Figure 12:
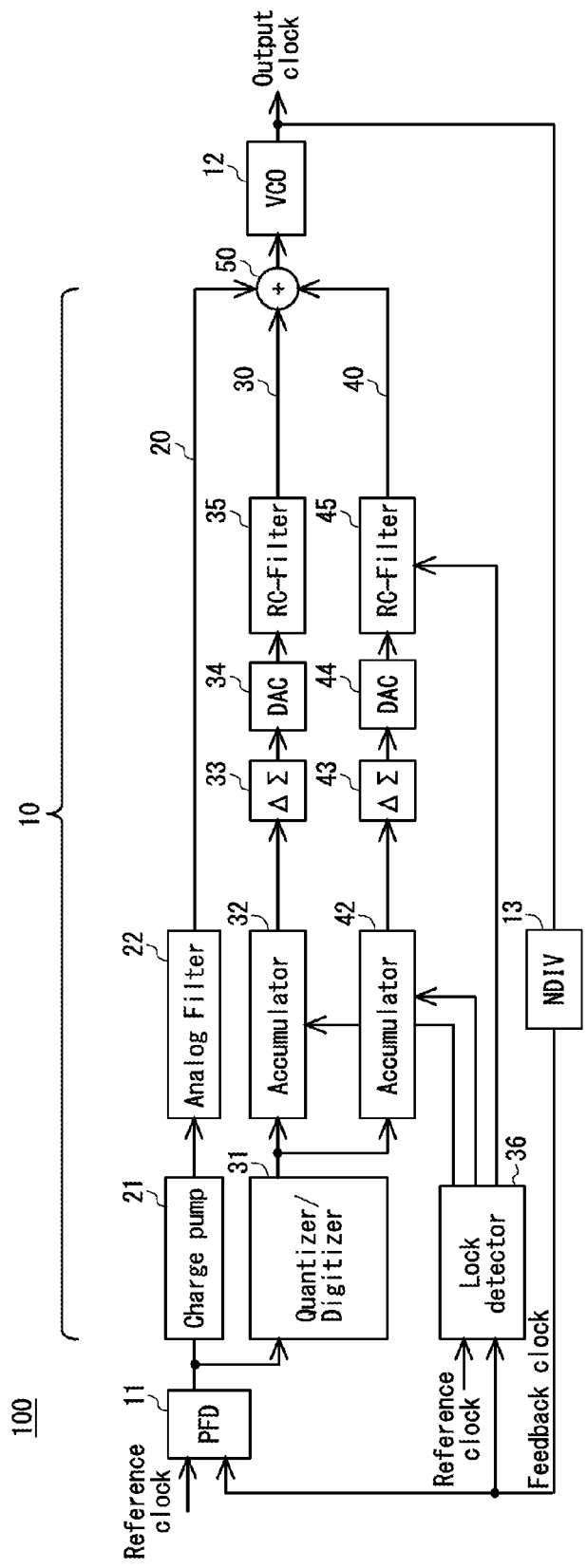
FIG. 12 is a circuit diagram showing a configuration of a PLL circuit according to Modified Example 1.

The configuration of the PLL circuit 100 according to Modified Example 1 will be described with reference to FIG. 12. FIG. 12 is a circuit diagram showing the configuration of the PLL circuit 100 according to Modified Example 1. Modified Example 1 differs from the first to third embodiments in regard to the input of the lock detector 36. The components of Modified Example 1 other than the lock detector 36 are similar to the components of the first to third embodiments, and thus the descriptions thereof are omitted.

The lock detector 36 receives the reference clock and the feedback clock. In other words, the lock detector 36 does not receive any digital signal from the quantizer 31. The lock detector 36 counts the number of reference clocks and the number of feedback clocks. The lock detector 36 detects the lock state based on the number of counts of the reference clock and the number of counts of the feedback clock. The lock detector 36 compares the number of counts of the reference clock with the number of counts of the feedback clock, and detects the lock state according to the comparison result. Also, with this configuration, the detection of the lock state can be appropriately performed. The lock detector 36 according to Modified Example 1 can be applied to any one of the first to third embodiments.

MODIFIED EXAMPLE 2

Figure 13:
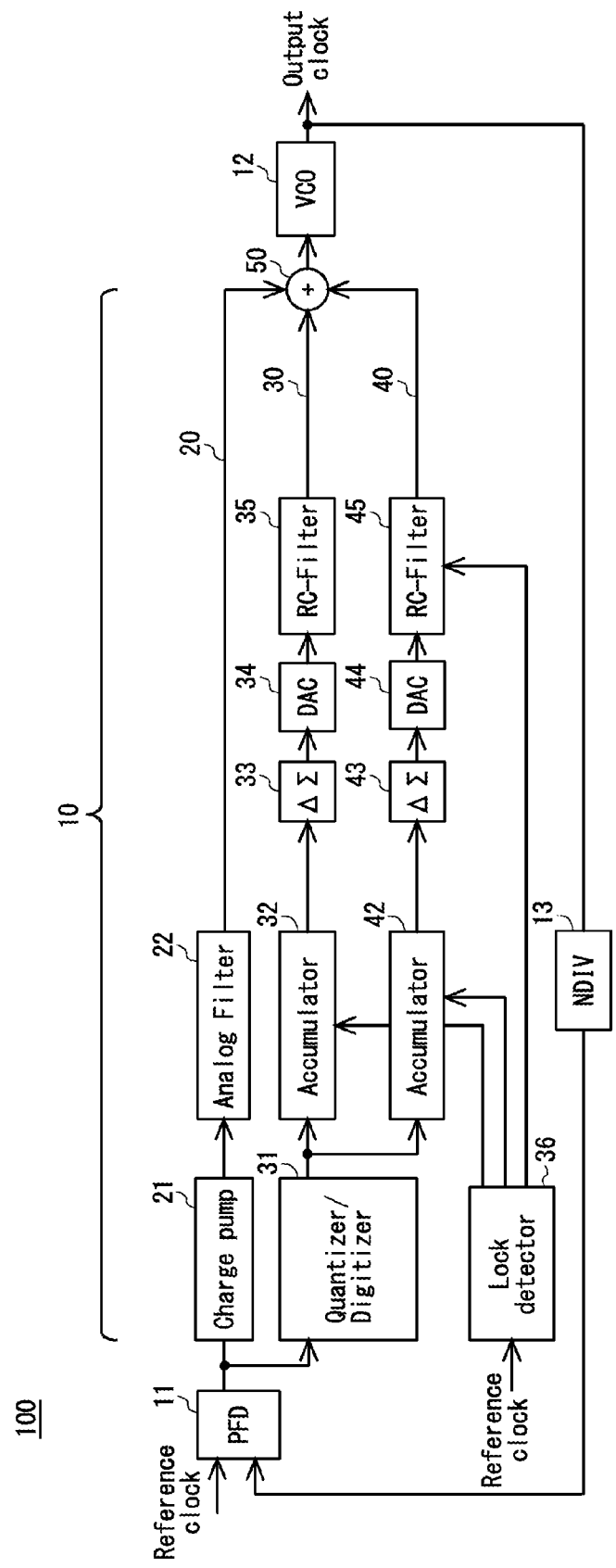
FIG. 13 is a circuit diagram showing a configuration of a PLL circuit according to Modified Example 2.

The configuration of the PLL circuit according to Modified Example 2 will be described with reference to FIG. 13. FIG. 13 is a circuit diagram showing the configuration of the PLL circuit 100 according to Modified Example 2. Modified Example 2 differs from the first to third embodiments in regard to the input of the lock detector 36. The components of Modified Example 2 other than the lock detector 36 are similar to the components of the first to third embodiments, and thus the descriptions thereof are omitted.

The lock detector 36 receives the reference clock, instead of the output from the quantizer 31. The lock detector 36 detects the lock state based on the number of counts of the reference clock. Specifically, the lock detector 36 performs mode switching based on the count value of the reference clock, i.e., an absolute time. Thus, the mode switching can be reliably performed. The lock detector 36 according to Modified Example 2 can be applied to any one of the first to third embodiments.

The first to third embodiments and Modified Examples 1 and 2 described above can be combined as desirable by one of ordinary skill in the art.

The invention made by the present inventor has been described in detail above. However, the present invention is not limited to the embodiments described above, and can be modified in various ways without departing from the scope of the invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A PLL circuit comprising:
   a phase comparator configured to detect a phase difference between a reference clock and a feedback clock;
   an oscillator configured to generate a signal to be returned to the phase comparator; and
   a loop filter that is disposed between the phase comparator and the oscillator and includes an adder that adds an output from a proportional path, an output from a first integral path, and an output from a second integral path, wherein
   the proportional path includes:
   a charge pump configured to output a current according to a detection result from the phase comparator; and
   an analog filter that is provided after the charge pump, the first integral path includes:
   a first cumulative adder that has a variable gain and cumulatively adds digital signals according to the detection result from the phase comparator;
   a first D/A converter configured to perform a D/A conversion on a signal from the first cumulative adder; and
   a first filter that has a variable bandwidth and receives an analog signal from the first D/A converter,
   the second integral path includes:
   a second cumulative adder configured to cumulatively add the digital signals according to the detection result from the phase comparator;
   a second D/A converter configured to perform a D/A conversion on a signal from the second cumulative adder; and
   a second filter configured to receive an analog signal from the second D/A converter.

2. The PLL circuit according to claim 1, wherein
   the PLL circuit further comprises a lock detector that detects a lock state, controls the gain of the first cumulative adder and the bandwidth of the first filter according to a detection result of the lock state, and switches an input to the second D/A converter to a fixed value.

3. The PLL circuit according to claim 2, wherein
   when the lock detector detects the lock state, the lock detector sets the gain of the first cumulative adder to be lower than a gain of the second cumulative adder, and sets the bandwidth of the first filter to be narrower than a bandwidth of the second filter, and
   when the lock detector detects a unlock state, the lock detector sets the input to the second D/A converter to the fixed value.

4. The PLL circuit according to claim 2, wherein when the lock detector detects the lock state, the lock detector locks an input of the first D/A converter with an output code used when the lock state is detected.

5. The PLL circuit according to claim 1, wherein when an output code of the second cumulative adder reaches an upper limit or a lower limit, the first integral path performs background calibration to allow the output code of the second cumulative adder to be returned to a center code.

6. The PLL circuit according to claim 2, wherein the lock detector detects the lock state by comparing a number of counts of the reference clock with a number of counts of the feedback clock.

7. The PLL circuit according to claim 2, wherein the lock detector detects the lock state based on a number of counts of the reference clock.

8. The PLL circuit according to claim 2, further comprising a quantizer configured to quantize a detection result from the phase comparator,
   wherein the lock detector detects the lock state based on an output from the quantization.

9. The PLL circuit according to claim 1, wherein
   the second cumulative adder has a variable gain, and
   the second filter has a variable bandwidth.

10. A PLL circuit comprising:
    a phase comparator configured to detect a phase difference between a reference clock and a feedback clock;

an oscillator configured to generate a signal to be returned to the phase comparator;
a loop filter that is disposed between the phase comparator and the oscillator and includes an adder that adds an output from a proportional path, an output from a first integral path, and an output from a second integral path; and
a lock detector that detects a lock state based on the phase different between the reference clock and the feedback clock, and controls at least one of a gain and a bandwidth in the first integral path.

* * * * *